US009343268B2

(12) United States Patent
Yoshikawa et al.

(10) Patent No.: US 9,343,268 B2
(45) Date of Patent: May 17, 2016

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventors: Ryoichi Yoshikawa, Kanagawa (JP); Munehiro Ogasawara, Kanagawa (JP)

(73) Assignee: Nuflare Technology, Inc., Yokohama (JP)

( * ) Notice: Subject to any disclaimer, the term of this patent is extended or adjusted under 35 U.S.C. 154(b) by 0 days.

(21) Appl. No.: 14/528,652

(22) Filed: Oct. 30, 2014

(65) Prior Publication Data

US 2015/0064934 A1   Mar. 5, 2015

Related U.S. Application Data

(60) Continuation of application No. 14/199,535, filed on Mar. 6, 2014, now Pat. No. 8,907,306, which is a division of application No. 13/597,699, filed on Aug. 29, 2012, now Pat. No. 8,710,467.

(30) Foreign Application Priority Data

Sep. 1, 2011  (JP) ................................. 2011-190957

(51) Int. Cl.
*H01L 21/263* (2006.01)
*H01J 37/317* (2006.01)
(Continued)

(52) U.S. Cl.
CPC ............. *H01J 37/3177* (2013.01); *B82Y 10/00* (2013.01); *B82Y 40/00* (2013.01); *H01J 37/3026* (2013.01);
(Continued)

(58) Field of Classification Search
CPC ............. H01J 37/3174; H01J 37/3177; H01J 37/3026; H01J 2237/31764; H01J 37/28; H01J 37/3045; H01J 37/045; H01J 2237/31766; H01J 37/20; H01J 2237/0435; H01J 2237/304; H01J 2237/30483; H01J 2237/31761; H01J 2237/31754

See application file for complete search history.

(56) References Cited

U.S. PATENT DOCUMENTS 5,260,579 A * 11/1993 Yasuda et al. .............. 250/492.2
5,393,987 A    2/1995 Abboud et al.
(Continued)

FOREIGN PATENT DOCUMENTS

JP    5-166707    7/1993
JP    2005-116743    4/2005
(Continued)

OTHER PUBLICATIONS

Korean Office Action issued Sep. 12, 2013, in Korea patent Application No. 10-2012-0096304 (with English translation).
(Continued)

*Primary Examiner* — Michael Logie
(74) *Attorney, Agent, or Firm* — Oblon, McClelland, Maier & Neustadt, L.L.P.

(57) ABSTRACT

In accordance with one aspect of this invention, a multi charged particle beam writing apparatus includes an aperture member, in which a plurality of openings are formed, configured to form multi-beams by making portions of the charged particle beam pass through the plurality of openings; a plurality of blankers configured to perform blanking-deflect regarding beams corresponding to the multi-beams; a writing processing control unit configured to control writing processing with a plurality of beams having passed through different openings among the plurality of openings being irradiated on the target object at a predetermined control grid interval; and a dose controlling unit configured to variably control a dose of a beam associated with deviation according to a deviation amount when an interval between the plurality of beams irradiated is deviated from the control grid interval.

8 Claims, 14 Drawing Sheets

(51) Int. Cl.
   *H01J 37/302* (2006.01)
   *B82Y 10/00* (2011.01)
   *B82Y 40/00* (2011.01)
   *H01L 21/308* (2006.01)

(52) U.S. Cl.
   CPC .......... *H01J 37/3174* (2013.01); *H01L 21/263* (2013.01); *H01L 21/2633* (2013.01); *H01L 21/3085* (2013.01); *H01J 2237/31764* (2013.01); *H01J 2237/31766* (2013.01)

(56) References Cited

U.S. PATENT DOCUMENTS

| | | | |
|---|---|---|---|
| 5,546,319 A * | 8/1996 | Satoh et al. | 250/396 R |
| 5,920,077 A * | 7/1999 | Oae et al. | 250/492.22 |
| 6,188,074 B1 * | 2/2001 | Satoh | B82Y 10/00 250/492.2 |
| 6,657,210 B1 * | 12/2003 | Muraki | 250/492.22 |
| 6,768,118 B2 | 7/2004 | Nakayama et al. | |
| 6,835,937 B1 | 12/2004 | Muraki et al. | |
| 6,870,171 B2 | 3/2005 | Hosoda et al. | |
| 6,903,352 B2 | 6/2005 | Muraki et al. | |
| 7,276,714 B2 | 10/2007 | Platzgummer et al. | |
| 7,842,926 B2 | 11/2010 | Olsson et al. | |
| 8,586,951 B2 | 11/2013 | Yoshikawa et al. | |
| 8,610,082 B2 | 12/2013 | Sano et al. | |
| 8,692,218 B2 | 4/2014 | Muraki et al. | |
| 8,710,467 B2 | 4/2014 | Yoshikawa et al. | |
| 8,890,095 B2 * | 11/2014 | Steenbrink et al. | 250/492.22 |
| 2002/0008207 A1 * | 1/2002 | Muraki et al. | 250/398 |
| 2004/0061064 A1 * | 4/2004 | Ono et al. | 250/396 R |
| 2004/0089822 A1 | 5/2004 | Ogasawara | |
| 2004/0143356 A1 * | 7/2004 | Yoda | B82Y 10/00 700/121 |
| 2005/0072941 A1 * | 4/2005 | Tanimoto et al. | 250/492.22 |
| 2006/0060775 A1 | 3/2006 | Sakakibara et al. | |
| 2006/0169927 A1 * | 8/2006 | Muraki et al. | 250/492.23 |
| 2008/0067402 A1 * | 3/2008 | Muraki et al. | 250/396 R |
| 2009/0001267 A1 * | 1/2009 | Enyama et al. | 250/310 |
| 2009/0200495 A1 | 8/2009 | Platzgummer | |
| 2010/0038554 A1 | 2/2010 | Platzgummer et al. | |
| 2012/0061583 A1 | 3/2012 | Wieland et al. | |
| 2012/0305768 A1 * | 12/2012 | Yamamoto et al. | 250/310 |

FOREIGN PATENT DOCUMENTS

| | | |
|---|---|---|
| JP | 2005-322918 | 11/2005 |
| JP | 2006-261342 | 9/2006 |
| JP | 2008-536331 | 9/2008 |

OTHER PUBLICATIONS

Office Action issued Sep. 24, 2014 in Taiwanese Application No. 101131536 (with English translation).

Office Action issued Jul. 14, 2015 in Japanese Patent Application No. 2011-190957 (with English translation).

* cited by examiner

MULTI CHARGED PARTICLE BEAM WRITING APPARATUS AND MULTI CHARGED PARTICLE BEAM WRITING METHOD

CROSS-REFERENCE TO RELATED APPLICATION

This application is a continuation of U.S. application Ser. No. 14/199,535 filed Mar. 6, 2014. U.S. application Ser. No. 14/199,535 is a divisional of U.S. application Ser. No. 13/597,699 filed on Aug. 29, 2012. U.S. application Ser. No. 13/597,699 is based upon and claims the benefit of priority from prior Japanese Patent Application No. 2011-190957 filed on Sep. 1, 2011 in Japan, the entire contents of which are incorporated herein by reference.

BACKGROUND OF THE INVENTION

1. Field of the Invention

Embodiments described herein relate generally to a multi charged particle beam writing apparatus and a multi charged particle beam writing method, and for example, a method for making a plurality of irradiation positions by multi-beams with high precision.

2. Related Art

A lithography technique that is charge in the progress of refinement of a semiconductor device is a very important process to generate a unique pattern in a semiconductor fabricating process. In recent years, with high integration of LSI, a line width of a circuit required for the semiconductor device has been refined every year. Herein, an electron ray (electron beam) writing technique intrinsically has excellent resolution and a pattern is written on a wafer and the like by using an electron ray.

For example, a writing apparatus using multi-beams is used. As compared with a case of writing the pattern by using one electron beam, since a lot of beams may be irradiated once by using the multi-beams, throughput may be significantly improved. In the multi-beam type writing apparatus, for example, an electron beam emitted from an electron gun passes through a mask having a plurality of holes to form the multi-beams, the multi-beams are blanking-controlled, and each beam which is not shielded is reduced by using an optical system, and is deflected by using a deflector to be irradiated to a desired point on a target object (see Published Unexamined Japanese Patent Application No. 2006-261342 (JP-A-2006-261342), for example).

In the multi-beam type writing apparatus, the plurality of beams are irradiated at a time and irradiation positions of the plurality of beams are required to be adjusted with high precision. For example, with respect to the written pattern, the reduction rate of a lens of the optical system is adjusted, such that it is considered to adjust the size by adjusting the size of each beam. However, when a lens condition is changed, a phenomenon in which the pattern rotates or a phenomenon in which field deformation is changed occurs. As a result, it is difficult to set the lens condition to an optimized state together with a lot of other parameters required for the optical system so that the size precision becomes high precision. In the case of mechanical rotation fitting, adjustment of an accurate rotational position of an nm order is required, which is not realistic. In the case of field deformation, first, the field is deformed in the optical system, in principle. As fabrication precision, in order to adjust the fabrication precision to precision of, for example, nm or less (for example, 0.1 nm), a significantly close design is required, which is not also realistic. In designing the optical system, even though the optical system may be designed with high precision, setting ranges of other design parameters are limited. As a result, when field deformation intends to be modified, optimization of these other conditions (for example, resolution performance, focal depth, and the like) may be interfered. When equalization of a magnetic field intends to be promoted in order to reduce deformation, for example, a huge lens barrel is required. A lot of complicated correction mechanisms are required in order to reduce deformation and an excessive burden is applied to the apparatus. After the writing apparatus is manufactured, adjustment to an actual apparatus is required, but although deformation intends to be modified, parameters of writing are complicatedly related to each other, and thus a parameter for modifying the deformation is not an independent variable. Therefore, optimization is difficult or enormous amount of time is required although the optimization may be achieved.

As described above, in the multi-beam type writing apparatus, the plurality of beams are irradiated at a time and irradiation positions of the plurality of beams are required to be adjusted with high precision. In the multi-beam type, beams that pass through different molding holes are partially overlapped and connected, and a pattern having a desired figure shape is formed. When the beam is deviated from a desired irradiation position due to deformation of the optical system and the like, an overlap amount among the irradiation beams is deviated and it is difficult to write the pattern with high precision.

BRIEF SUMMARY OF THE INVENTION

In accordance with one aspect of this invention, a multi charged particle beam writing apparatus includes a stage on which a target object is placed and which is continuously movable; an emitting unit configured to emit charged particle beam; an aperture member, in which a plurality of openings are formed, configured to receive irradiation of the charged particle beam on a region including all the plurality of openings, and to form multi-beams by making portions of the charged particle beam pass through the plurality of openings; a plurality of blankers configured to perform blanking-deflect regarding beams corresponding to the multi-beams passing through the plurality of openings of the aperture member, respectively; a blanking aperture member configured to shield each of the beams deflected by the plurality of blankers so that the beams deflected by the plurality of blankers are beam-off; a deflector configured to deflect beams together, which have passed through the blanking aperture member, at each irradiation position of each beam on the target object; a writing processing control unit configured to control writing processing with a plurality of beams having passed through different openings among the plurality of openings being irradiated on the target object at a predetermined control grid interval; and a dose controlling unit configured to variably control a dose of a beam associated with deviation according to a deviation amount when an interval between the plurality of beams irradiated is deviated from the control grid interval.

In accordance with another aspect of this invention, a multi charged particle beam writing method includes emitting a charged particle beam; receiving irradiation of the charged particle beam on a region including all of a plurality of openings of an aperture member in which the plurality of openings are formed and forming multi-beams by making portions of the charged particle beam pass through the plurality of openings; performing writing processing with a plurality of beams having passed through different openings among the plurality of openings being irradiated on a target object at a predetermined control grid interval; and variably controlling a dose of a beam associated with deviation according to a deviation amount when an interval between the plurality of beams irradiated is deviated from the control grid interval.

DETAILED DESCRIPTION OF THE INVENTION

Hereinafter, in embodiments, a writing apparatus and a writing method that suppress variation in pattern shape or size by deviation of irradiation positions of multi-beams caused by deformation of an optical system and the like will be described.

Hereinafter, in the embodiments, as one example of a charged particle beam, a configuration using an electron beam will be described. However, the charged particle beam is not limited to the electron beam and may include a beam using charged particles, which include an ion beam and the like.

First Embodiment

Figure 1:
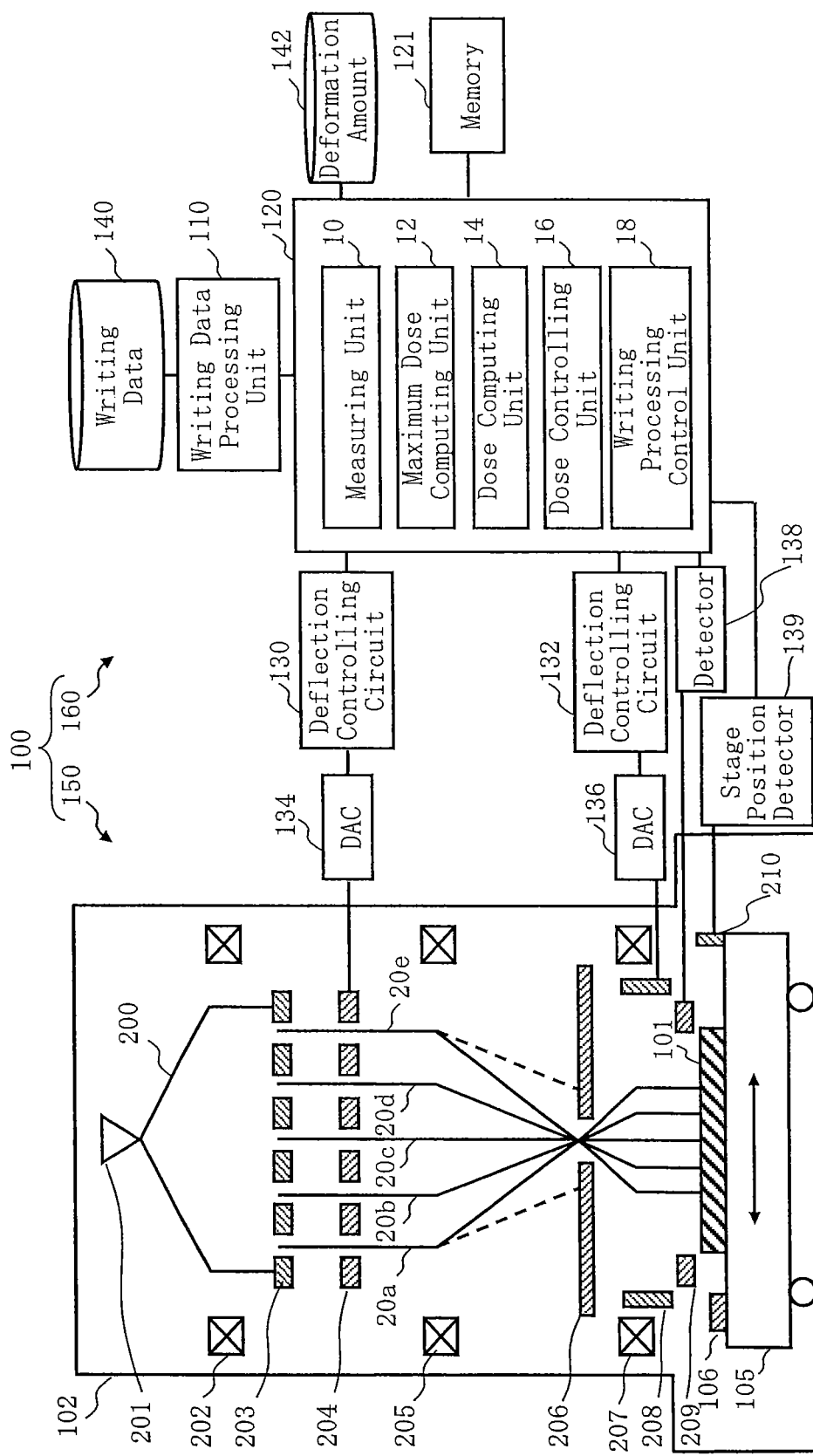
FIG. 1 is a conceptual diagram illustrating a configuration of a writing apparatus in a first embodiment.

FIG. 1 is a conceptual diagram illustrating a configuration of a writing apparatus in a first embodiment. In FIG. 1, a writing apparatus 100 (or "drawing apparatus") includes a writing unit 150 and a control unit 160. The writing apparatus 100 is one example of a multi charged particle beam writing apparatus. The writing unit 150 includes an electron lens barrel 102 and a writing chamber 103. In the electron lens barrel 102, an electron gun 201, an illumination lens 202, an aperture member 203, a blanking plate 204, a reduction lens 205, a limiting aperture member 206, an objective lens 207, a deflector 208, and a detector 209 are placed. In the writing chamber 103, an XY stage 105 is placed. On the XY stage 105, a target object 101 such as a mask serving as a substrate to be written or "drawn" while writing or "drawn" is placed. An exposure mask at the time of fabricating a semiconductor device or a semiconductor substrate (silicon wafer) where the semiconductor device is fabricated is included in the target object 101. A mask blank coated with resist, in which nothing is written, is included in the target object 101. On the XY stage 105, a mark 106 and a position measuring mirror 210 are also placed. The mark 106 is configured by, for example, a cross-shaped pattern.

The control unit 160 includes control calculators 110 and 120, a memory 121, deflection control circuits 130 and 132, digital-to-analog converting (DAC) amplifiers 134 and 136, an amplifier 138, a stage position measuring unit 139, and memory devices 140 and 142 including a magnetic disk device and the like. The control calculators 110 and 120, the memory 121, the deflection control circuits 130 and 132, the amplifier 138, the stage position measuring unit 139, and the memory devices 140 and 142 including the magnetic disk device and the like are connected to each other through a bus (not illustrated). Writing data is inputted into the memory device 140 (data storage unit) from the outside and stored in the memory device 140.

In the control calculator 120, a measuring unit 10, a maximum dose computing unit 12, a dose computing unit 14, a dose controlling unit 16, and a writing processing control unit 18 are placed. Functions of the measuring unit 10, the maximum dose computing unit 12, the dose computing unit 14, the dose controlling unit 16, and the writing processing control unit 18 may be configured by hardware including an electric circuit and the like and may be configured by software including programs executing the functions and the like. Alternatively, the functions may be configured by combining hardware and software. Information inputted into/outputted from the measuring unit 10, the maximum dose computing unit 12, the dose computing unit 14, the dose controlling unit 16, and the writing processing control unit 18 and information during computation are stored in the memory 121 in each case.

Herein, in FIG. 1, components required to describe the first embodiment are illustrated. In general, the writing apparatus 100 may include other required components.

Figure 2A:
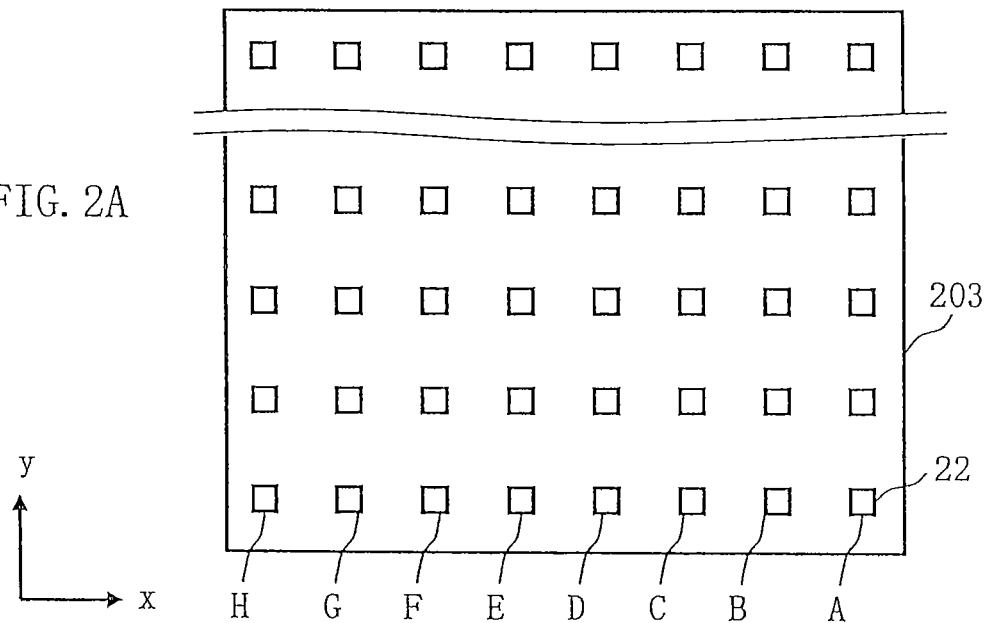
FIGS. 2A and 2B are conceptual diagrams illustrating a configuration of an aperture member in the first embodiment.
Figure 2B:
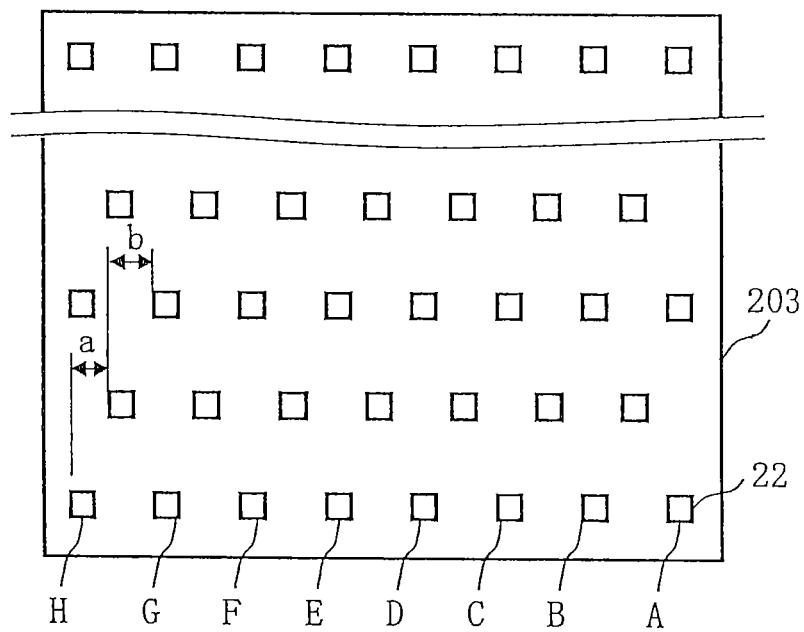

FIGS. 2A and 2B are conceptual diagrams illustrating a configuration of an aperture member in the first embodiment. In FIG. 2A, holes (openings) 22 of m columns long (y direction)×n columns wide (x direction) (m, n≥2) are formed in the aperture member 203 at a predetermined array pitch. In FIG. 2A, for example, holes 22 of 512×8 columns are formed. The respective holes 22 are all formed in a rectangle, for example, a rectangle or a quadrangle having the same size and shape. Alternatively, the respective holes 22 may be formed in a circle having the same outer diameter. Herein, an example is illustrated, in which 8 holes 22 of A to H are formed in the x direction with respect to the columns in the y direction, respectively. Portions of electron beam 200 pass through the plurality of holes 22 to form the multi-beams 20. Herein, the example in which two or more columns of holes 22 are placed in both the vertical direction and the horizontal direction (x and y directions) is described, but the embodiment is not limited thereto. For example, a plurality of columns may be placed in any one of the vertical direction and the horizontal direction (x and y directions) and only one column may be placed in the other one. An array method of the holes 22 is not limited to a case in which the holes 22 are placed in a lattice pattern vertically and horizontally, as illustrated in FIG. 2A. As illustrated in FIG. 2B, for example, a hole on a $1^{st}$ column and a hole on a $2^{nd}$ column in the vertical direction (y direction) may be deviated and placed by a size a in the horizontal direction (x direction). Similarly, holes on a $2^{nd}$ column and a hole on a $3^{rd}$ column in the vertical direction (y direction) may be deviated and placed by a size b in the horizontal direction (x direction).

Figure 3:
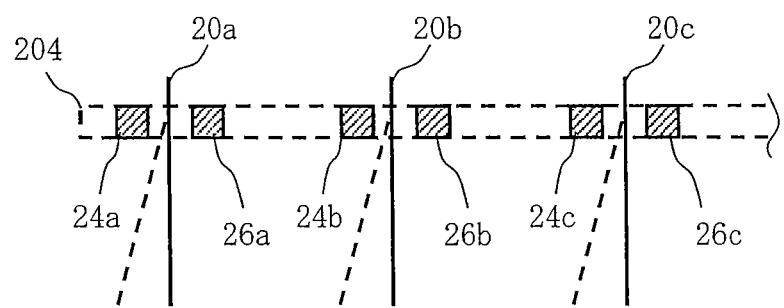
FIG. 3 is a conceptual diagram illustrating a configuration of a blanking plate in the first embodiment.

FIG. 3 is a conceptual diagram illustrating a configuration of a blanking plate in the first embodiment. In the blanking plate 204, a through-hole is formed at a placement position of each hole 22 of the aperture member 203 and a set (blanker) of two electrodes 24 and 26 which form a pair is placed in each through-hole. The electron beam 20 passing through each through-hole is independently deflected by voltage applied to the two electrodes 24 and 26 which form a pair. Blanking control is achieved by the deflection. As such, a plurality of blankers perform blanking-deflect regarding beams corresponding thereto, respectively, among the multi-beams having passed through the plurality of holes 22 (openings) of the aperture member 203.

The electron beam 200 emitted from the electron gun 201 (emitting unit) illuminate the entire aperture member 203 substantially vertically by the illumination lens 202. A plurality of rectangular holes (openings) are formed in the aperture member 203, and the electron beam 200 illuminate a region including all the plurality of holes. The electron beam 200 pass through the plurality of holes of the aperture member 203 to form, for example, a plurality of rectangular electron beams (multi-beams) 20a to 20e. Each of the multi-beams 20a to 20e pass through a corresponding blanker of the blankers in the blanking plate 204. The blankers deflect the electron beams 20 individually passing therethrough, respectively. The sizes of the multi-beams 20a to 20e having passed through the blanking plate 204 are reduced by the reduction lens 205 and advance toward a center hole formed in the limiting aperture member 206. Herein, the electron beams 20 deflected by the blankers of the blanking plate 204 are deviated from the center hole of the limiting aperture member 206 (blanking aperture member), and shielded by the limiting aperture member 206. Meanwhile, the electron beams 20 which are not deflected by the blankers of the blanking plate 204 pass through the center hole of the limiting aperture member 206. Blanking control is performed and on/off of the beams is controlled, by on/off of the blankers. As such, the limiting aperture member 206 shields each of the beams deflected by the plurality of blankers so that the beams deflected by the plurality of blankers are beam-off. One-time shot beam is formed by a beam having passed through the limiting aperture member 206, which is formed until the beams are off after the beams are on. The multi-beams 20 having passed through the limiting aperture member 206 are in focus by the objective lens 207 and become a pattern image of a desired reduction rate, and the respective beams (all of the multi-beams 20) having passed through the limiting aperture member 206 are deflected together in the same direction by the deflector 208 and irradiated to each irradiation position of each beam on the target object 101. For example, when the XY stage 105 continuously moves, the beams are controlled by the deflector 208 so that the irradiation positions of the beams follow the movement of the XY stage 105. The multi-beams 20 that are irradiated at a time are ideally arrayed with a pitch acquired by multiplying the aforementioned desired reduction rate by the array pitch of the plurality of holes of the aperture member 203. The writing apparatus 100 performs a writing operation in a raster scan scheme in which shot beams are continuously irradiated in sequence and when a desired pattern is written, unnecessary beams are controlled to be beam-off by the blanking control.

Figure 4A:
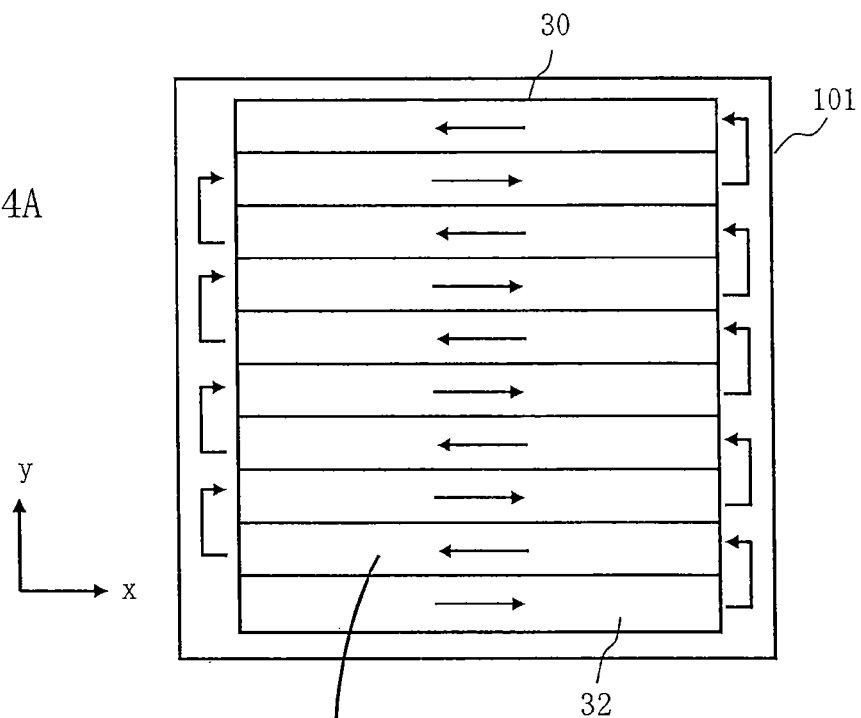
FIGS. 4A to 4C are conceptual diagrams for describing a writing operation in the first embodiment.
Figure 4B:
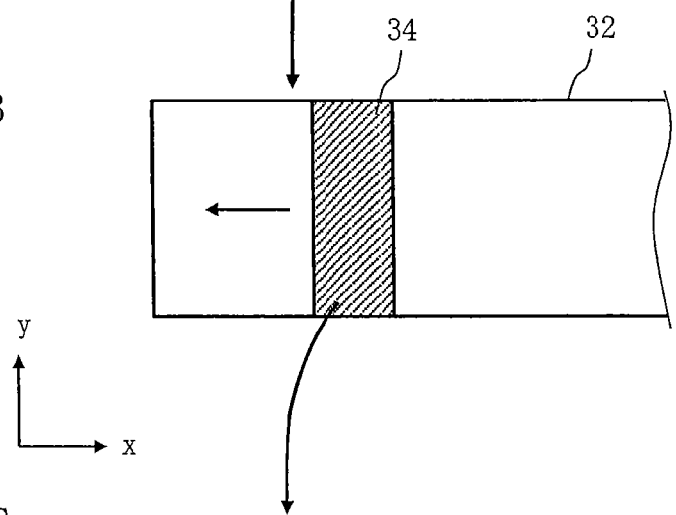
Figure 4C:
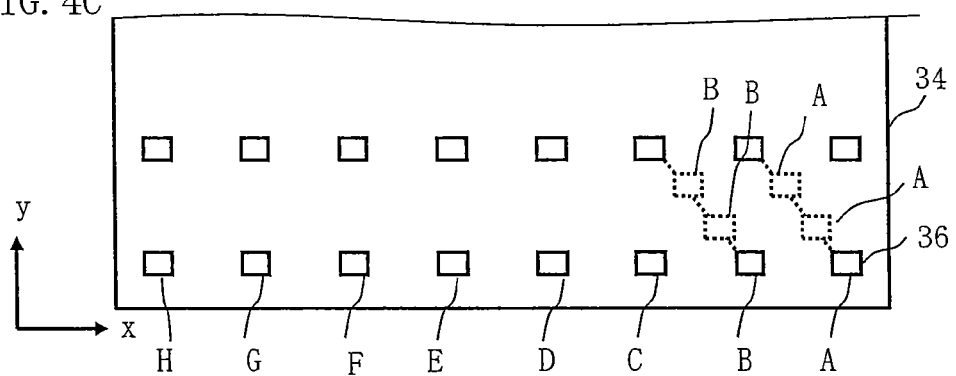

FIGS. 4A to 4C are conceptual diagrams for describing a writing operation in the first embodiment. As illustrated in FIG. 4A, a writing region 30 of the target object 101 is virtually divided into, for example, a plurality of reed-shaped stripe regions 32 at a predetermined width in the y direction. Each stripe region 32 becomes a writing unit region. First, by moving the XY stage 105, an irradiation region 34 which may be irradiated by one-time irradiation of the multi-beams 20 is adjusted to be positioned at a left end of a $1^{st}$ stripe region 32 or at the more left side, and writing starts. When the $1^{st}$ stripe region 32 is written, writing is performed relatively in the x direction by moving the XY stage 105 in, for example, a −x direction. The XY stage 105 is moved, for example, continuously at a predetermined velocity. After writing the $1^{st}$ stripe region 32 is terminated, the irradiation region 34 is adjusted to be positioned at a right end of a $2^{nd}$ stripe region 32 or at a more right side relatively in the y direction by moving the stage in a −y direction and at this time, as illustrated in FIG. 4B, writing is performed similarly in the −x direction by moving the XY stage 105 in, for example, the x direction. As described that writing is performed in the x direction in a $3^{rd}$ stripe region 32 and writing is performed in the −x direction in a $4^{th}$ stripe region 32, a writing time may be reduced by performing writing while alternately changing the direction. However, writing is not limited to the case in which writing is performed by alternately changing the direction, when each stripe region 32 is written, writing may be performed in the same direction. When each stripe 32 is written, each stripe 32 is written in a raster scan scheme in which the shots are deflected to sequentially move (scan) in the y direction by the deflector 208 while the XY stage 105 moves in the x direction, and shot beams are continuously irradiated in sequence. For example, when an x-direction movement velocity and a y-direction scanning velocity are 1:1, as illustrated in FIG. 4C, in the case of a shot pattern 36 by a beam having passed through one hole A of the aperture member 203, the beams are sequentially irradiated while being deviated in a direction of an angle of 45° (a direction of 135°) from the y direction to the −x direction, from an irradiation position at the $1^{st}$ time. Similarly, in the case of a shot pattern 36 by a beam having passed through one hole B of the aperture member 203, the beams are sequentially irradiated while being deviated in the direction of the angle of 45° from the y direction to the −x direction, from the irradiation position at the $1^{st}$ time. Similarly even in the case of a shot pattern 36 by each beam having passed through H from each hole C of the aperture member 203, the beams are sequentially irradiated while being deviated in the direction of the angle of 45° from the y direction to the −x direction, from the irradiation position at the $1^{st}$ time. As such, writing is performed in each region surrounded by beams in 2×2 vertically and horizontally, which are irradiated at a time, in the raster scan scheme. Each region surrounded by the beams of 2×2 vertically and horizontally includes the positions of two horizontal beams in a lower part in the figure and the positions of two upper beams are included in a $1^{st}$ y-direction region of the corresponding region.

Figure 5:
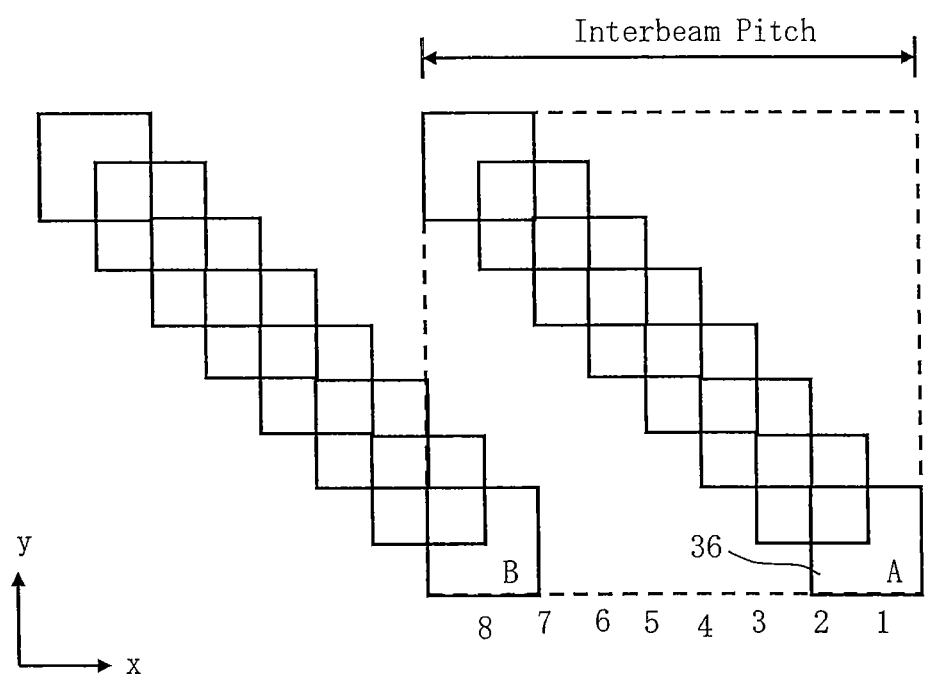
FIG. 5 is a conceptual diagram for describing a writing operation of raster scan in the first embodiment.

FIG. 5 is a conceptual diagram for describing a writing operation of raster scan in the first embodiment. For example, when 8 holes A to H are formed in the x direction with respect to the aperture member 203, a plurality of shot beams are irradiated in each region surrounded by the beams in 2×2 vertically and horizontally, which are irradiated at a time, while the stage moves between the shot patterns 36 adjacent to each other in the x direction in which the beams are irradiated once. For example, the size of a control grid (AU: address unit) placed in a lattice shape with a predetermined quantization size is set to a size in which each region surrounded by the beams in 2×2 vertically and horizontally, which are irradiated once, has nAU×nAU, and each region surrounded by the beams in 2×2 vertically and horizontally is irradiated by n shot beams at an AU (control grid) interval, while the stage moves. Herein, the size of the AU is set to a size in which each region surrounded by the ideal beams in 2×2 vertically and horizontally irradiated at a time, has 8 AU×8 AU, and each region surrounded by the beams in 2×2 vertically and horizontally is shot every AU and irradiated by 8 shot beams, while the stage moves. For example, an $8^{th}$ shot of the hole A is irradiated to a point deviated from a $1^{st}$ shot of the adjacent hole B in the y direction by 8 AU. When each region is shot every AU, an irradiation method to allow the shot patterns 36 to be overlapped with each other in the x and y directions is preferable to achieve pattern precision, with respect to the shot pattern 36 by the beam having passed through one hole A of the aperture member 203. Herein, for example, the beam size is set to be twice larger than the AU. In this case, the beams are irradiated so that the shot patterns 36 are overlapped with each other in ½ in the x and y directions.

Figure 6:
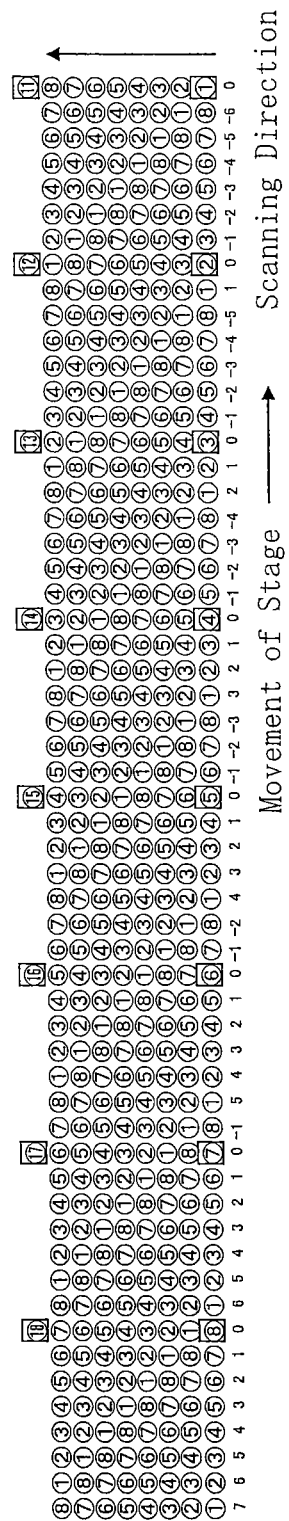
FIG. 6 is a conceptual diagram for, in more detail, describing one example of an irradiation position of each shot in the case in which a stage moves by a length which is n times an inter-beam pitch in the first embodiment.

FIG. 6 is a conceptual diagram for, in more detail, describing one example of an irradiation position of each shot in the case in which a stage moves by a length which is n times an inter-beam pitch in the first embodiment. In FIG. 6, among numbers surrounded by a circle, '1' represents a shot position by the beam having passed through each hole A of the aperture member 203. In FIG. 6, among the numbers surrounded by the circle, '2' represents a shot position by the beam having passed through each hole B of the aperture member 203. In FIG. 6, among the numbers surrounded by the circle, '3' represents a shot position by the beam having passed through each hole C of the aperture member 203. In FIG. 6, among the numbers surrounded by the circle, '4' represents a shot position by the beam having passed through each hole D of the aperture member 203. In FIG. 6, among the numbers surrounded by the circle, '5' represents a shot position by the beam having passed through each hole E of the aperture member 203. In FIG. 6, among the numbers surrounded by the circle, '6' represents a shot position by the beam having passed through each hole E of the aperture member 203. In FIG. 6, among the numbers surrounded by the circle, '7' represents a shot position by the beam having passed through each hole G of the aperture member 203. In FIG. 6, among the numbers surrounded by the circle, '8' represents a shot position by the beam having passed through each hole H of the aperture member 203. Further, '11' to '18' represent respective holes positioned on the first column in the Y direction, which are other than each of the holes A to H of the aperture member 203. Points surrounded by quadrangles represent the positions of the holes A to H of the aperture member 203. The shot patterns 36 by the beams having passed through the holes A to H of the aperture member 203 are ideally irradiated to points spaced apart from each other by the inter-beam pitch. When the stage moves in a length which is n times (herein, 8 times) larger than the inter-beam pitch while the inter-beam pitch is shot n times (herein, 8 times) at the AU (control grid) interval, each region surrounded by the beams in 2×2 vertically and horizontally, which are irradiated once, is fully filled with each shot pattern 36 by the beam having passed through each of the holes A to H of the aperture member 203. When beams of unnecessary shots among these shots are off according to the shape of a pattern to be written, a pattern with a desired shape may be written on the target object 101 by connecting the remaining shot patterns 36 to each other.

In FIG. 6, a movement direction of the stage is set as a +X direction and all the beams are controlled to be scanned in a Y direction straight thereto. This shape is conceptually illustrated with an arrow at the right side of FIG. 6. The scan start timing under an opening (hole) position of the aperture is represented as T=−6 to 7, based on T=0. FIG. 6 schematically illustrates a writing position where each beam starts scanning at the time of T=0. In this example, the entire surface is fully painted by the beam shot while the writing position moves relatively in a −X direction by performing Y scanning with the +X-direction stage movement of the stage. When 0-th Y-direction scanning is terminated at T=0, the beam position is deviated from the neighboring beam by 1 AU (in the −X direction) and herein, the 1st (T=1) scanning starts. The movement velocity of the stage is controlled so that the beam position is deviated from the neighboring beam by 1 AU (in the −X direction) at the time when the 1st Y scanning is terminated. Writing is performed similarly even with respect to the Y-direction vertical beams and the beam shot may be achieved so as to fully paint the entire surface every AU unit. Various patterns are written depending on the amount of irradiation applied to each beam shot.

Figure 7:
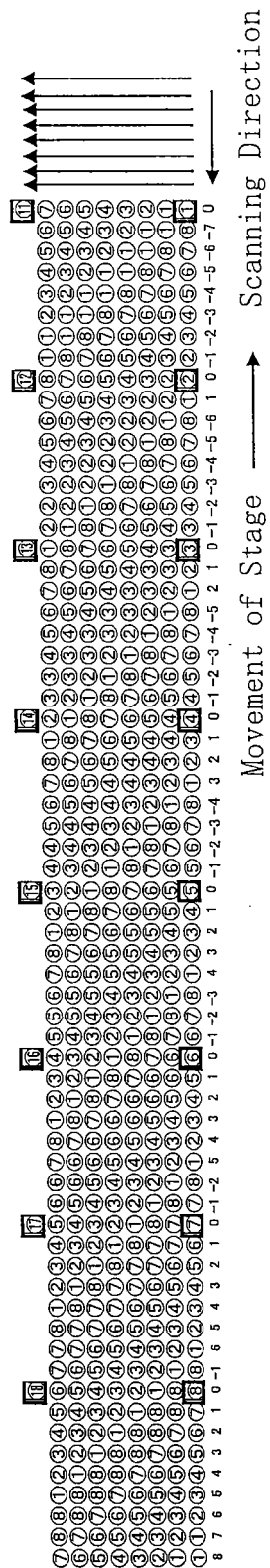
FIG. 7 is a conceptual diagram for, in more detail, describing another example of an irradiation position of each shot in the case in which the stage moves by a length which is n times an inter-beam pitch in the first embodiment.

FIG. 7 is a conceptual diagram for, in more detail, describing another example of an irradiation position of each shot in the case in which a stage moves by a length which is n times an inter-beam pitch in the first embodiment. In FIG. 7, the relationship between the number surrounded by the circle and the position of each hole of the aperture member 203 is the same as that in FIG. 6. Further, '11' to '18' represent respective holes positioned on the first column in the Y direction, which are other than each of the holes A to H of the aperture member 203. The points surrounded by the quadrangles represent the positions of the holes A to H of the aperture member 203. FIG. 7 illustrates a modified example of FIG. 6. In this example, X-direction scanning is combined with the example of FIG. 6. When the 0-th (T=0) Y scanning is terminated, an origin position (scanning start position) coincides with a 0-th (T=0) scanning start position of a beam having passed through a left hole, in the example of FIG. 7. In other words, the velocity of the stage is controlled as above. Y scanning starts while a $1^{st}$ (T=1) scanning start position is deviated (X-scanned) by 1 control unit (1 AU) to the left (in the −X direction) so as to prevent overlapping with the writing position of the beam of the left hole. This processing is repeated in sequence. When scanning is terminated at the time of T=7, the quantity of X-direction deflection is restored to 0 and the same processing is repeated again.

Figure 8:
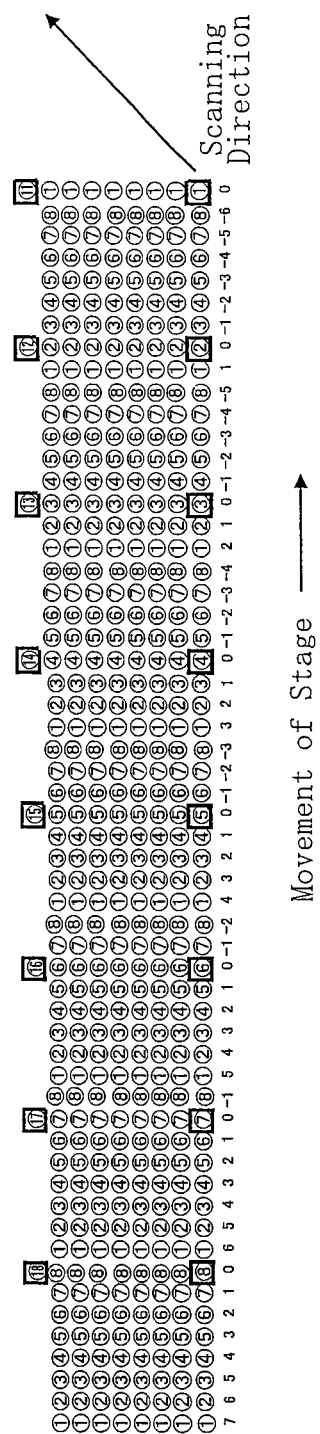
FIG. 8 is a conceptual diagram for, in more detail, describing another example of an irradiation position of each shot in the case in which the stage moves by a length which is n times an inter-beam pitch in the first embodiment.

FIG. 8 is a conceptual diagram for, in more detail, describing another example of an irradiation position of each shot in the case in which a stage moves by a length which is n times an inter-beam pitch in the first embodiment. FIG. 8 illustrates a new modified example of FIG. 6. In FIG. 8, the relationship between the number surrounded by the circle and the position of each hole of the aperture member 203 is the same as that in FIG. 6. Further, '11' to '18' represent respective holes positioned on the first column in the Y direction, which are different from each of the holes A to H of the aperture member 203. The points surrounded by the quadrangles represent the positions of the holes A to H of the aperture member 203. In the example of FIG. 8, Y scanning is performed substantially at 45° by following the movement of the stage. As a result, as illustrated in FIG. 8, an irradiation position by Y scanning is not moved in the X direction but sequentially written in the +Y direction. The movement velocity of the stage is controlled so that the beam position is deviated from the neighboring beam by 1 AU (in the −X direction) at the time when the 1st Y scanning is terminated. When writing is performed as such, the irradiation position of each beam may be a writing position arranged on the XY.

Figure 9:
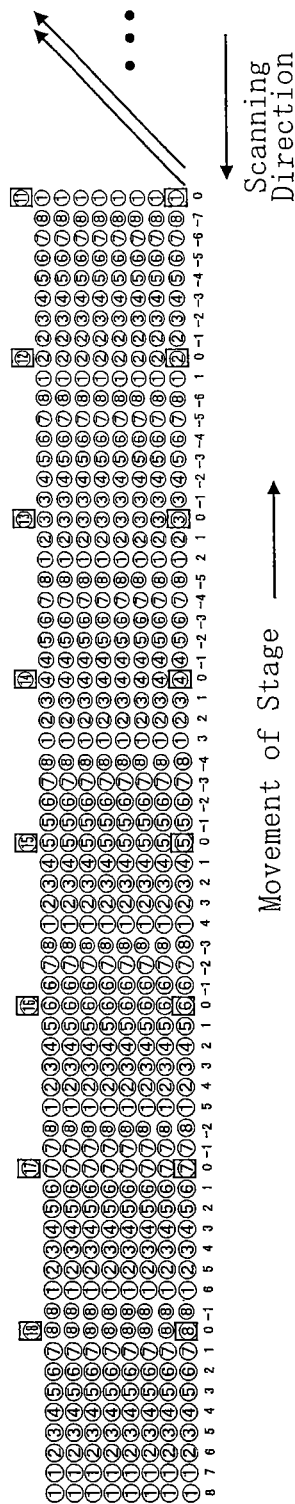
FIG. 9 is a conceptual diagram for, in more detail, describing another example of an irradiation position of each shot in the case in which the stage moves by a length which is n times an inter-beam pitch in the first embodiment.

FIG. 9 is a conceptual diagram for, in more detail, describing another example of an irradiation position of each shot in the case in which a stage moves by a length which is n times an inter-beam pitch in the first embodiment. FIG. 9 illustrates a new modified example of FIG. 8. In FIG. 9, the relationship between the number surrounded by the circle and the position of each hole of the aperture member 203 is the same as that in FIG. 6. Further, '11' to '18' represent respective holes positioned on the first column in the Y direction, which are other than each of the holes A to H of the aperture member 203. The points surrounded by the quadrangles represent the positions of the holes A to H of the aperture member 203. FIG. 9 illustrates an example in which X-direction scanning is combined with the example of FIG. 8. Simultaneously with Y-direction scanning, when the writing position is sequentially controlled to move in the X direction by following the velocity of the stage, the writing position is written at the positions that sequentially move in the Y direction. When Y scanning following 0-th (T=0) of the stage is terminated, an origin position (scanning start position) coincides with a 0-th (T=0) scanning start position of a beam having passed through a left hole, in the example of FIG. 9. In other words, the velocity of the stage is controlled as above. Y scanning following the movement of the stage starts while a $1^{st}$ (T=1) scanning start position is deviated by 1 control unit (1 AU) to the left (in the −X direction) by X scanning so as to prevent overlapping with the writing position of the beam of the left hole. This processing is repeated in sequence. When scanning is terminated at the time of T=7, the quantity of X-direction deflection is restored to 0 and the same processing is repeated again. Herein, for example, when the velocity of Y-direction scanning is changed, a Y-direction shot interval is changed.

As one example of the irradiation position of each shot is illustrated in FIGS. 6 to 9, various scanning methods combined with the movement of the stage may be selected. A method of performing writing by only Y-direction scanning has a merit that control may be simple, but flexibility is short beyond X-direction scanning. Meanwhile, a method of combining X and Y-direction scannings has a merit with more options. For example, as illustrated in the examples of FIGS. 6 to 9, when the scanning method is switched, writing by changing the number of shots among the beams (by changing the control unit) is enabled. They may be selected according to a request for design.

Figure 10:
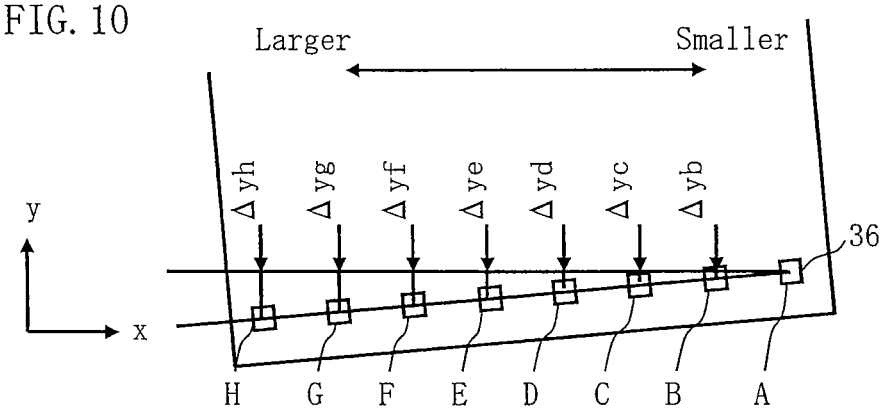
FIG. 10 is a conceptual diagram illustrating one example of a positional deviation amount of the multi-beams which is irradiated at a time in the first embodiment.

FIG. 10 is a conceptual diagram illustrating one example of a positional deviation amount of the multi-beams which is irradiated once in the first embodiment. FIG. 10 illustrates, for example, a case in which the irradiation positions of the shot patterns 36 by the multi-beams 20 irradiated once, which have passed through the holes A to H of the aperture member 203 are deviated in proportion to the y direction. Causes of the positional deviation may include an influence by deformation of the optical system, an influence by deviation of a rotational direction of a mechanical installation position of the aperture member 203 or the like. As such, in reality, the beam is not irradiated to an ideal position and positional deviation occurs due to optical system, mechanical installation deviation or the like. In this case, based on the irradiation position of the beam having passed through the hole A, the positional deviation amount Δy (Δyb to Δyh) is gradually increased toward the hole H. Therefore, when raster scan is performed, in connections of the respective shots illustrated in FIGS. 6 to 9, the positional deviation amount between the shot pattern 36 of the beam having passed through the hole A and the shot pattern 36 of the beam having passed through the hole H has the largest value. As a result, connection precision between the shot pattern 36 of the beam having passed through the hole A and the shot pattern 36 of the beam having passed through the hole H has the smallest value, and is the most influenced due to an error in the shape or position of the formed pattern.

Figures 11A, 11B:
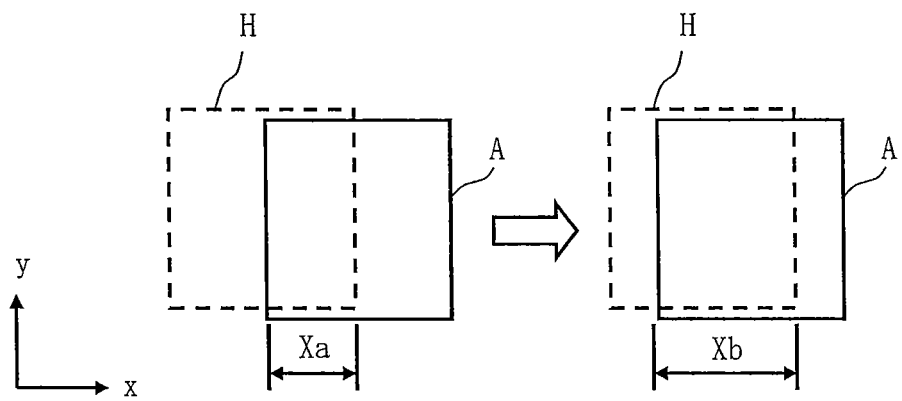
FIGS. 11A and 11B are diagrams illustrating one example of an overlapping state of shot patterns in the first embodiment.

FIGS. 11A and 11B are diagrams illustrating one example of an overlapping state of shot patterns in the first embodiment. As illustrated in FIG. 11A, in a design step, an overlapping amount of the shot patterns (the shot of the hole A and the shot of the hole H) is Xa (for example, ½ of the beam size (shot patterns size)). Therefore, as illustrated in FIG. 11B, the overlapping amount is deviated from an overlapping amount Xb and the overlapping amount Xa of a specified value due to deformation and the like (herein, an example in which the overlapping amount is further increased is described). In other words, an interval between the shot positions is deviated from the AU interval. If this goes on, the error occurs in the shape or position of the formed pattern. Accordingly, in the first embodiment, by variably controlling the dose of the beam of each shot pattern even when the positional deviation occurs, deviation of the shape of the pattern written on the target object, which may be occurred by the positional deviation, is corrected even when the positional deviation of the shot pattern occurs.

Figure 12:
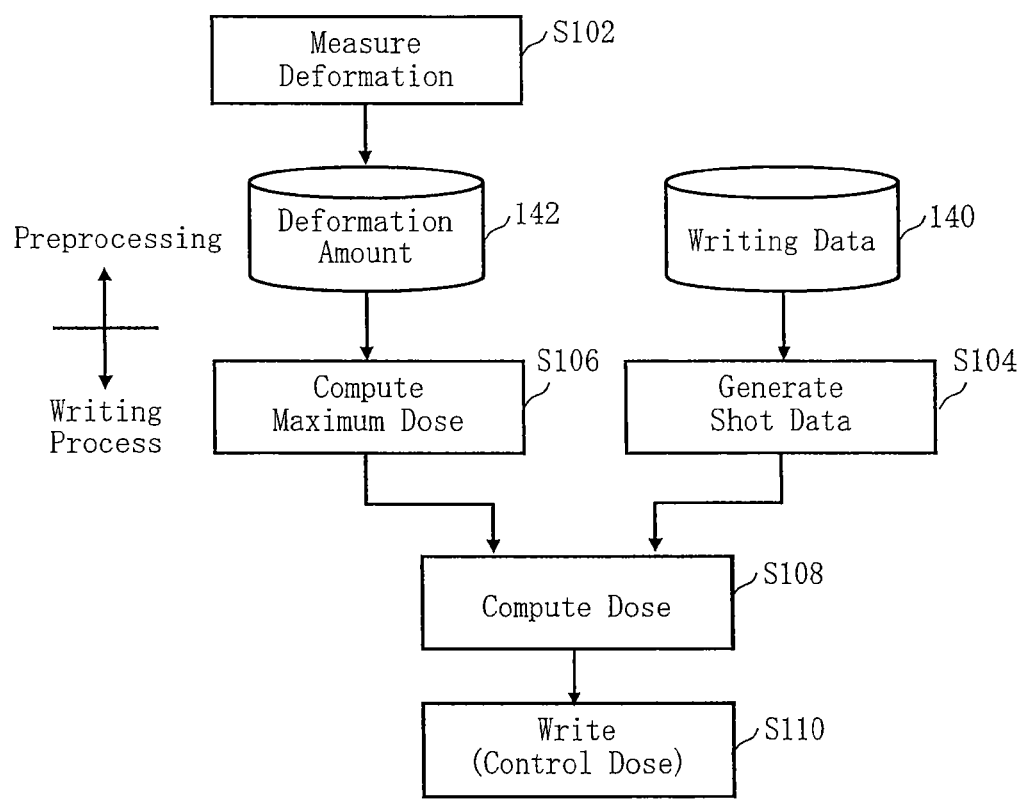
FIG. 12 is a flowchart illustrating a process of a primary unit in a multi-beam writing method in the first embodiment.

FIG. 12 is a flowchart illustrating a process of a primary unit in a multi-beam writing method in the first embodiment. In FIG. 12, the multi-beam writing method in the first embodiment executes a series of processes including a deformation measuring process (S102), a shot data generating process (S104), a maximum dose computing process (S106), a dose computing process (S108), and a writing process (dose controlling process) (S110).

First, in the deformation measuring process (S102) as preprocessing before executing writing processing, the measuring unit 10 measures a deformation amount of the shot patterns 36 by the multi-beams 20 having passed through the holes A to H of the aperture member 203. In detail, first, the XY stage is moved so that the mark 106 is positioned within a deflectable range of the beam having passed through one hole (for example, the hole A). The mark 106 on the XY stage 105 is scanned while the beam having passed through the hole (for example, the hole A) is deflected by using the deflector 208. The beams passing through the holes other than one hole (for example, the hole A) which is under measurement may be beam-off by blanking. Reflection electrons or secondary electrons are detected by using the detector 138 during the scanning operation. Measurement data of the detected reflection electrons or secondary electrons are outputted to the measuring unit 10. The stage position measuring unit 139 irradiates a laser to the mirror 210, receives reflected laser light, and measures the position of the XY stage 105. The position of the stage at the time of performing the scanning is measured by the stage position measuring unit 139, and a measurement result is outputted to the measuring unit 10. The measuring unit 10 measures a difference between a mark position presented from the measured stage position and a mark position presented from the measurement data of the detected reflection electrons or secondary electrons, and measures the deformation amount of the shot pattern 36 by the beam having passed through the hole (for example, the hole A). The measuring unit 10 performs the measurement one by one similarly even with respect to the remaining holes, and measures the deformation amounts of the shot patterns 36 by the multi-beams 20 having passed through the holes A to H of the aperture member 203. Herein, although the holes (the holes A to H) on the 1$^{st}$ column in the y direction are described, the deformation amounts of the shot patterns 36 by the beams passing through the holes are measured with respect to the multi-beams 20 passing through the holes in m×n vertically and horizontally. The measured deformation amounts are stored in the memory device 142. In addition, writing processing starts.

In the shot data generating process (S104), the control calculator 110 serving as a writing data processing unit reads writing data from the memory device 140 and performs data conversion processing of a plurality of steps to generate device's unique shot data. In the shot data, information indicating whether or not each shot is irradiated (beam on/off) is defined based on ideal coordinates (the control grid interval AU, as an example) with no deformation. A coordinate of the irradiation position and the like are also defined. The dose of each shot may be appropriately defined together. By defining the dose of each shot, pattern position smaller than the control grid interval AU could be expressed. Alternatively, the dose may be set to a predetermined value in advance.

Figure 13:
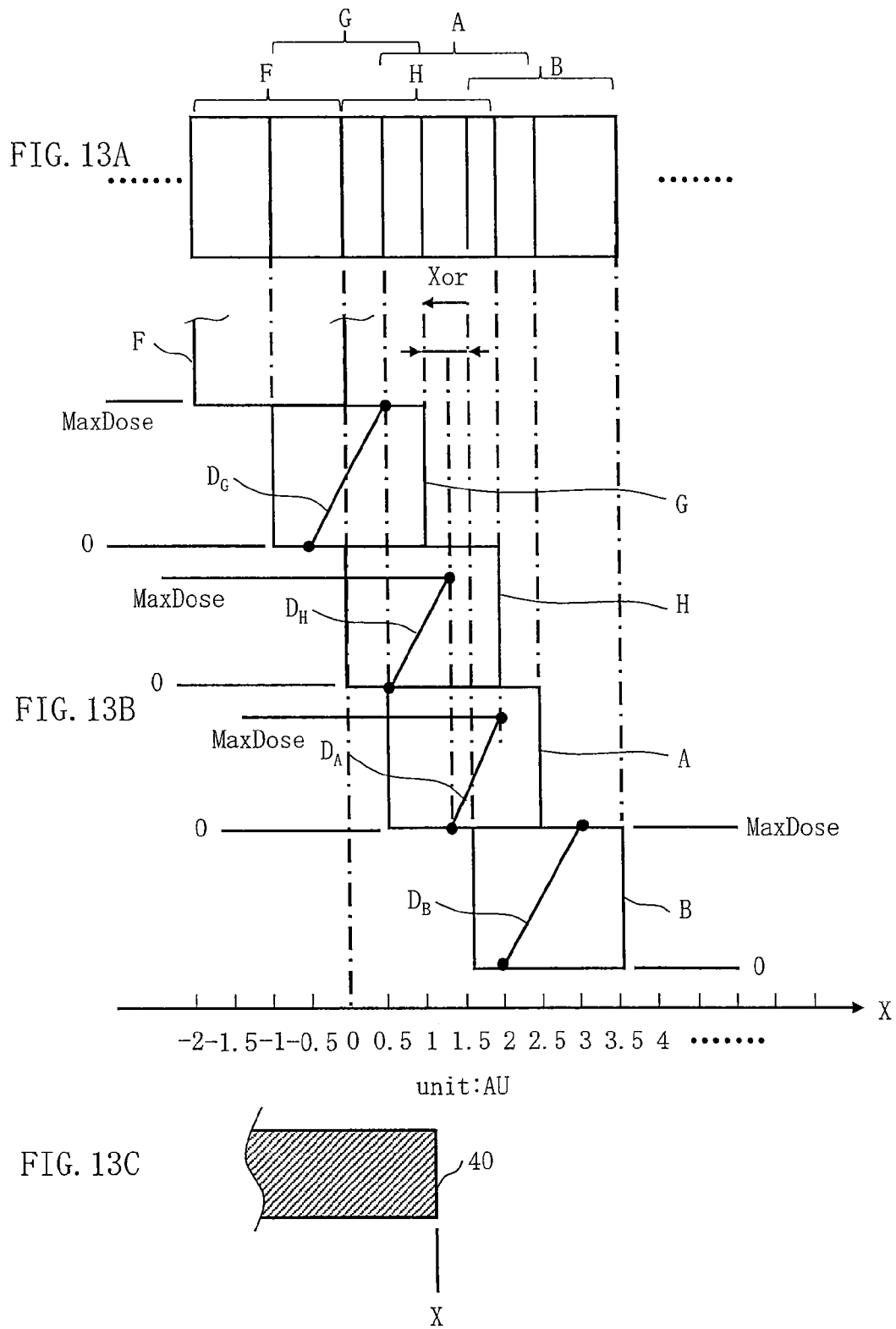
FIGS. 13A to 13C are conceptual diagrams for describing the relationship between an overlapping situation of the shot patterns and a dose in the first embodiment.

FIGS. 13A to 13C are conceptual diagrams for describing the relationship between an overlapping situation of the shot patterns and a dose in the first embodiment. FIG. 13A illustrates one example of an overlapping situation when the shot pattern by the beam having passed through the hole F of the aperture member 203, the shot pattern by the beam having passed through the hole G, the shot pattern by the beam having passed through the hole H, the shot pattern by the beam having passed through the hole A, and the shot pattern by the beam having passed through the hole B are sequentially irradiated. FIG. 13A illustrates as one example a case in which an overlapping amount of only an overlapping situation of the shot pattern by the beam having passed through the hole H and the shot pattern by the beam having passed through the hole A is more than the specified overlapping amount (herein, ½ of the beam size). In other words, a case in which the interval of the irradiation position is narrower than the AU is illustrated. A case in which other overlapping amounts of the shot patterns are specified values as they are is illustrated as one example. FIG. 13B illustrates the shot patterns which are deviated vertically to easily determine the overlapping amounts. Herein, an x-direction position is illustrated every 0.5 AU with the size of the AU on an X axis. FIG. 13B illustrates the shot position (center position) by the beam having passed through the hole G as x=0. FIG. 13C illustrates a written pattern 40 as one example and illustrates an edge position (end position) X of the pattern 40, which is acquired from the shot data generated by the shot data generation process (S104). In FIG. 13B, the doses to be set with respect to the beams passing through the respective holes are illustrated in a graph by the position of the edge position X of the pattern 40. In FIG. 13B, the dose to be set is illustrated as a y axis every shot pattern in the graph. In this case, herein, a vertical size (y size) of each shot pattern is selected as a general maximum dose. In FIGS. 13A and 13B, a difference acquired by subtracting an overlapping amount more than the specified value by a surplus from the overlapping amount of the shot patterns by the beams having passed through the hole H and the hole A is defined as an overlapping amount Xor. In other words, the irradiation position pitch ideally coincides with the AU and the deviation amount which is narrower than the AU due to deformation is set as the overlapping amount Xor. As seen from FIG. 13B, the beam size is twice larger than the AU in this example.

In the maximum dose computing process (S106), the maximum dose computing unit 12 computes the maximum dose of each beam passing through each hole. In detail, for example, the maximum dose computing unit 12 acquires the irradiation position of each shot on the target object from the measured deformation amount, the writing method and the like, and computes the maximum dose of each shot of the beam passing through each hole. The maximum dose is computed according to the overlapping amount Xor. The maximum dose Dmax is defined as Equation (1) below by using the overlapping amount Xor, a beam size Bs, and the maximum dose $D_0$, which corresponds to a designated dose to be exposed on the target, having been set in advance.

$$D\max = \{1 - (Xor/Bs)\} \cdot D_0 \qquad (1)$$
$$= \{1 - (Xor/(2 \cdot AU))\} \cdot D_0$$

The maximum dose Dmax is the same with respect to the beams having passed through the hole H and the hole A, in association with the overlap. Further, with respect to the beams having passed through the other holes, the overlapping amount which is the specified value as it is, that is, Xor=0, and as a result, Dmax=$D_0$.

As such, the maximum dose Dmax is appropriately computed depending on a ratio between the bema size Bs and the overlapping amount Xor. When the entire surface of the shots which are overlapped more than the predetermined specified value by the surplus is fully written, the maximum dose Dmax is limited so that a total dose in the vicinity is the same (specified value). In the example of FIG. 13B, the maximum dose is limited from $D_0$ to Dmax with respect to the beam passing through the hole H and the beam passing through the hole A.

In the dose computing process (S108), the dose computing unit 14 reads the shot data and computes a dose D of the beam for each shot according to the shot data. In detail, for example, the dose computing unit 14 reads the shot data based on the irradiation position of each shot on the target object, which is acquired from the measured deformation amount, the writing method and the like, and computes the dose D of the beam for each shot according to the shot data. Each dose is calculated according to which position of the X coordinate illustrated in FIG. 13B the edge position X of the pattern 40 illustrated in FIG. 13C is positioned at.

First, a dose Dg of the beam passing through the hole G will be described.

In the case of X≤−0.5 AU, Dg=0 is computed.
In the case of −0.5 AU<X≤0.5 AU, Dg={(X+0.5 AU)/AU}·$D_0$ is computed.
In the case of X>0.5 AU, Dg=$D_0$ is computed.
Subsequently, a dose Dh of the beam passing through the hole H will be described.
In the case of X<0.5 AU, Dh=0 is computed.
In the case of 0.5 AU<X≤1.5 AU−(Xor/2), Dh={(X−0.5 AU)/AU}·$D_0$ is computed.
In the case of 1.5 AU−(Xor/2)<X, Dh=Dmax={1−(Xor/Bs)}·$D_0$ is computed.
Subsequently, a dose Da of the beam passing through the hole A will be described.
In the case of X≤1.5 AU−(Xor/2), Da=0 is computed.

In the case of 1.5 AU−(Xor/2)<X≤2.5 AU−Xor, Da={(X−1.5 AU+Xor)/AU}}·$D_0$ is computed.

In the case of 2.5 AU−Xor<X, Da=Dmax={1−(Xor/Bs)}·$D_0$ is computed.

Subsequently, a dose Db of the beam passing through the hole B will be described.

In the case of X≤2.5 AU−Xor, Db=0 is computed.

In the case of 2.5 AU−Xor<X≤3.5 AU−Xor, Db={(X−2.5 AU+Xor)/AU}·$D_0$ is computed.

In the case of 3.5 AU−Xor<X, Db=$D_0$ is computed.

As illustrated in FIG. 13B, a maximum dose maxDose of the dose of each beam passing through the hole H or A associated with the deviation is smaller than a maximum dose maxDose of the dose of the beam passing through the hole G or B which is not associated with the deviation. As illustrated in FIG. 13B, at an intermediate position (an intermediate position between the irradiation positions) of the neighboring beams passing through the holes H and A associated with the deviation, the dose of the beam is controlled so that a dose of one of the neighboring beams (herein, for example, the beam passing through the hole A) is 0 and a dose of the another one of the neighboring beams (herein, for example, the beam passing through the hole H) has the maximum dose of the another one of the neighboring beams.

Herein, the case in which the shot pattern deviated from the specified overlapping amount by the surplus is the shot patterns by the beam passing through the hole H and the beam passing through the hole A is described, but the same calculation may be performed even with respect to the shot patterns deviated from the specified overlapping amount among the shot patterns by the surplus remaining beams.

In the writing process (dose controlling process) (S110), as described above, the writing processing control unit 18 controls writing processing so that a plurality of beams having passed through different holes 22 among the plurality of holes 22 are written at the AU (control grid) interval on the target object 101. In other words, writing processing is controlled so that writing processing is performed while the irradiation ranges of the plurality of beams are overlapped with each other on the target object 101. In this case, the dose controlling unit 16 controls the dose of the beam associated with the deviation to be varied according to the deviation amount when the interval of beams irradiated is deviated from the AU (control grid) interval. In other words, when the overlapping amount is deviated from the predetermined specified amount, a dose of a beam associated with the overlapping is variably controlled according to the overlapping amount. In detail, the dose computed by the dose computing unit 14 is variably controlled. The dose controlling unit 16 outputs the dose of each shot to the deflection controlling circuit 130 and the deflection controlling circuit 130 computes a beam irradiation time according to the inputted dose. The beam irradiation time t may be acquired by dividing the dose D of each shot by a current density J. The deflection controlling circuit 130 outputs a controlling digital signal to the DAC amplifier 134 so that the shot is beam-on by the blanker for the beam irradiation time t when the corresponding shot is performed, converts the digital signal into an analog signal, which is amplified by using the DAC amplifier 134, and applies the amplified signal to the blanker corresponding to the blanking plate 204 as deflection voltage. As described above, the dose is variably controlled up to the maximum dose depending on the edge position of the pattern to be written. Meanwhile, the writing processing control unit 18 outputs deflection position data to the deflection controlling circuit 132 so that each beam is deflected at the irradiation position (coordinate) indicated by the shot data. The deflection controlling circuit 132 computes the deflection amount, outputs the controlling digital signal to the DAC amplifier 136, converts the digital signal into the analog signal, which is amplified by using the DAC amplifier 136, and applies the amplified signal to the deflector 208 as the deflection voltage. As a result, the multi-beams 20 that are shot at that time are collected and deflected.

Figure 14:
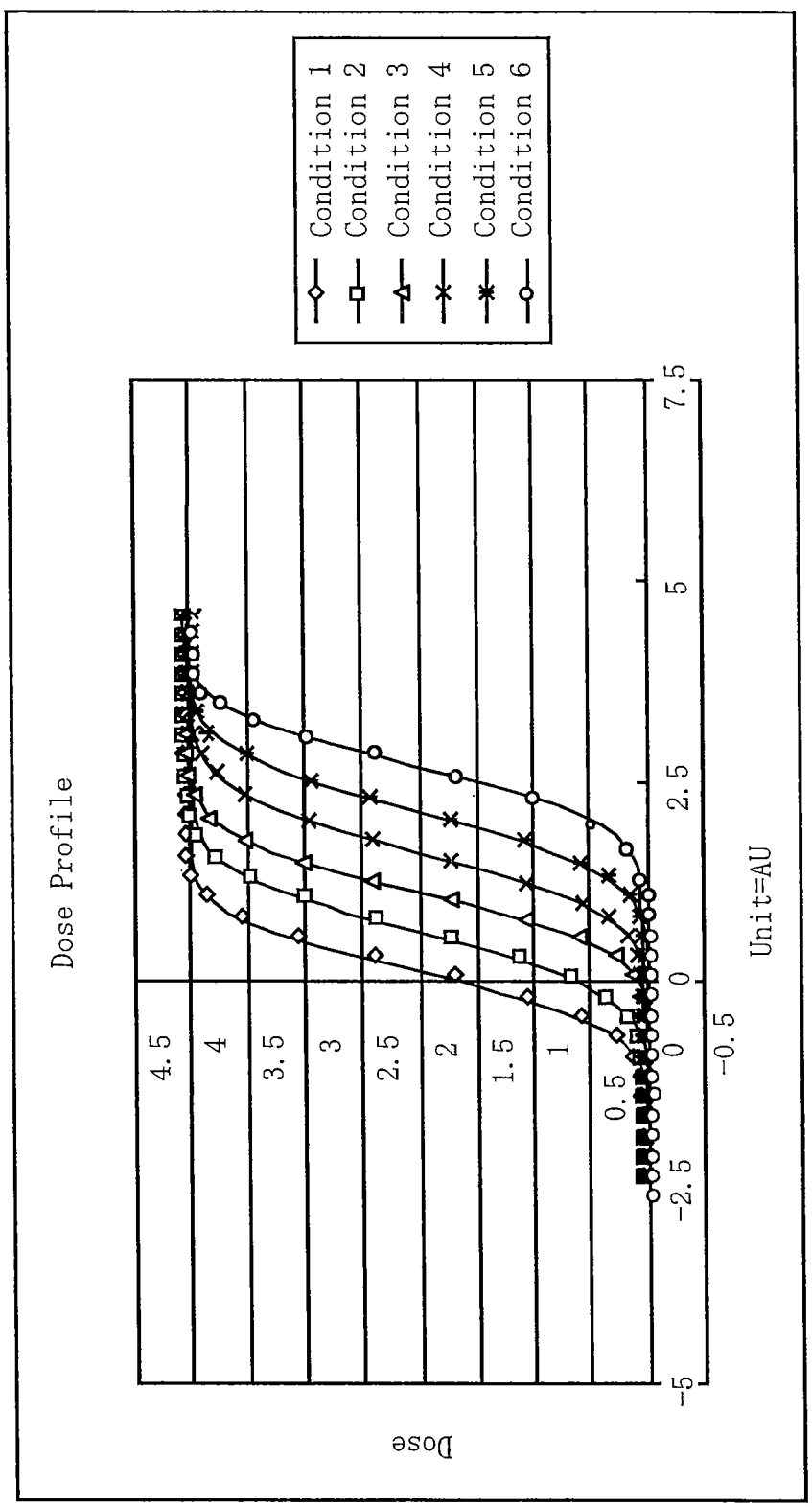
FIG. 14 is a graph illustrating a simulation result of a dose profile at each point when the pattern is written by the method of the first embodiment.

FIG. 14 is a graph illustrating a simulation result of a dose profile at each point when the pattern is written by the method of the first embodiment. It is assumed that the AU has a size which is a half of the beam size and beam resolution is equivalent to the AU as a σ value, and this result is acquired by a numerical simulation. For example, when the beam size is set to 20 nm, this result corresponds to a case in which the AU is 10 nm and the beam resolution σ is 10 nm. In FIG. 14, a horizontal axis indicates the x-direction position illustrated in FIG. 13B. A vertical axis indicates a dose amount as an arbitrary relative value. A dose profile at the edge position X when the edge position X of the pattern 40 is in sequence changed from 0 to 2.5 AU of the X axis illustrated in FIG. 13B by each 0.5 AU (Conditions 1 to 6) is illustrated. As illustrated in FIG. 14, it can be seen that computation may be performed so that the dose is variable in the calculation equation of the first embodiment, such that the dose profile is also moved in the x direction with the change in the edge position X of the pattern 40. For example, when a dose threshold for forming an edge is around '2', the process is performed while the dose amount at each position is also around '2' according to the change in the edge position X of the pattern 40. In other words, the edge position X may be pattern-formed with high precision.

As described above, according to the first embodiment, it is possible to suppress fluctuation in the shape or/and size of the pattern caused due to the deviation of the irradiation positions of the multi-beams, which is caused by the deformation of the optical system or the like. As a result, a high-precision pattern may be written with the multi-beams.

In FIG. 13B described above, each equation is defined while the shot position by the beam having passed through the hole G is X=0, but an expression method is not limited thereto. Hereinafter, each equation will be described through other expressions.

Figures 15A, 15B:
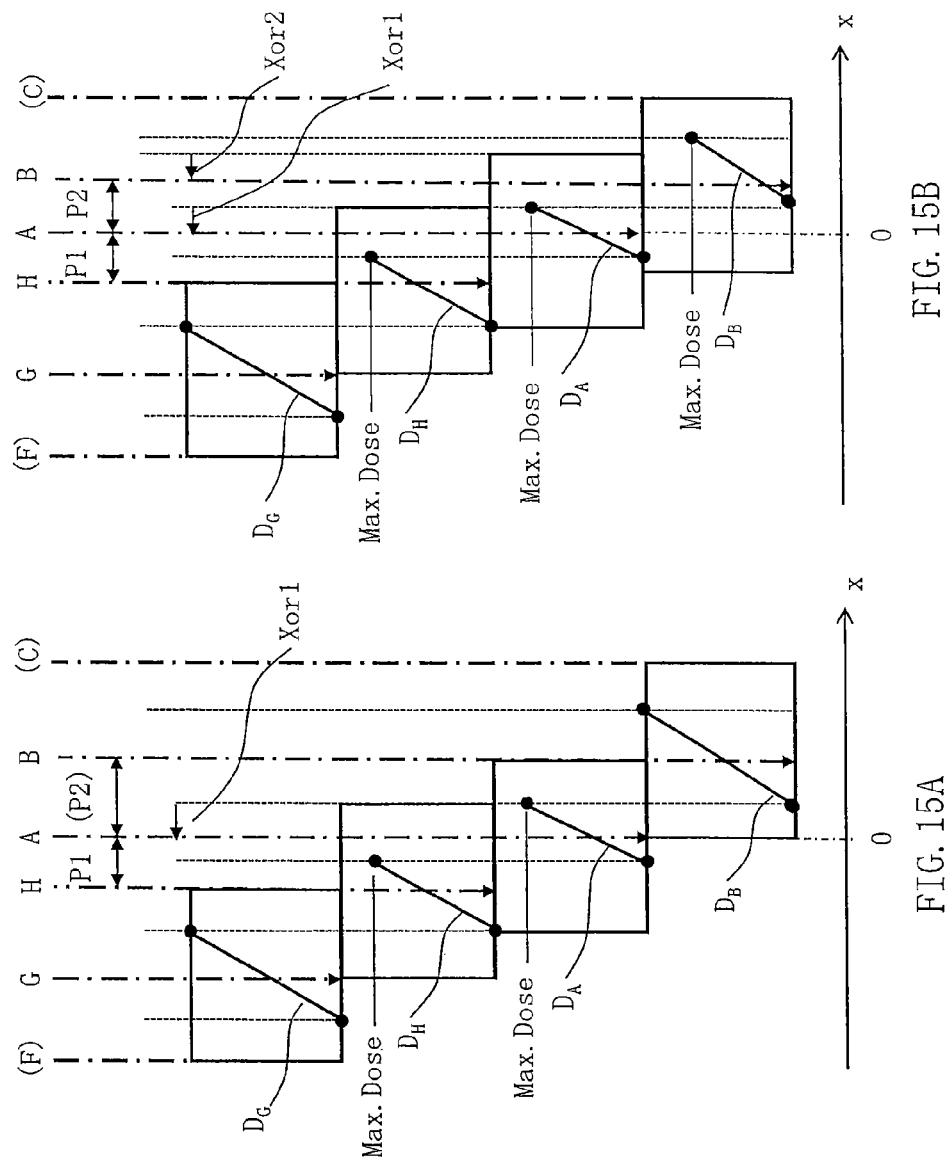
FIGS. 15A and 15B are conceptual diagrams illustrating another example for describing the relationship between the overlapping situation of the shot patterns and the dose in the first embodiment.

FIGS. 15A and 15B are conceptual diagrams illustrating another example for describing the relationship between the overlapping situation of the shot patterns and the dose in the first embodiment. FIGS. 15A and 15B illustrate one example of the overlapping situation when the shot pattern by the beam having passed through the hole G of the aperture member 203, the shot pattern by the beam having passed through the hole H, the shot pattern by the beam having passed through the hole A, and the shot pattern by the beam having passed through the hole B are sequentially irradiated. In FIGS. 15A and 15B, the shot position (irradiation position: center position) of each shot pattern is marked with one dotted line and the numbers A to H of the hole where each shot pattern is formed at each one dotted line. Further, a shot position of a shot pattern by a beam having passed through a hole F (not illustrated) is represented by F and a shot position of a shot pattern by a beam having passed through a hole C (not illustrated) is represented by C. In FIGS. 15A and 15B, the doses to be set with respect to the beams passing through the respective holes are illustrated in a graph by the position of the edge position X of the pattern 40 illustrated in FIG. 13C. The dose to be set is illustrated as the y axis every shot pattern in the graph. In this case, herein, the vertical size (y size) of each shot pattern is selected as the general maximum dose.

In FIG. 15A, the case in which the shot position (irradiation position: center position) of the shot pattern by the beam having passed through the hole A is deviated to the shot pattern by the beam having passed through the hole H is illustrated as one example, similarly as FIG. 13B. In other words, a case in which an interval P1 between the shot position (irradiation position: center position) of the shot pattern by the beam having passed through the hole H and the shot position (irradiation position: center position) of the shot pattern by the beam having passed through the hole A is smaller than the AU (control grid interval) is illustrated. A deviation amount in shot position between H and A is set as an overlapping amount Xor1. That is, a relationship of P1=AU−Xor1 is established. A case in which overlapping amounts of the other shot patterns are specified values as they are is illustrated as one example. In other words, a case in which the interval between the shot positions (irradiation position: center positions) of other shot patterns is the AU (control grid interval) is illustrated as one example. For example, an interval P2 between the shot position (irradiation position: center position) of the shot pattern by the beam having passed through the hole A and the shot position (irradiation position: center position) of the shot pattern by the beam having passed through the hole B coincides with the AU (control grid interval). Therefore, an overlapping amount Xor2 of the shot positions between the hole A and the hole B at that time is Xor2=0 and is not illustrated in FIG. 15A.

In FIG. 15B, the case in which the shot position of the shot pattern (irradiation position: center position) of the shot pattern by the beam having passed through the hole B is deviated to the shot pattern by the beam having passed through the hole A is illustrated as one example, from the situation of FIG. 15A. In other words, the interval P1 between the shot position (irradiation position: center position) of the shot pattern by the beam having passed through the hole H and the shot position (irradiation position: center position) of the shot pattern by the beam having passed through the hole A is narrower than the AU (control grid interval). The deviation amount in the shot position between H and A at that time is set as the overlapping amount Xor1. That is, the relationship of P1=AU−Xor1 is established. The interval P2 between the shot position (irradiation position: center position) of the shot pattern by the beam having passed through the hole A and the shot position (irradiation position: center position) of the shot pattern by the beam having passed through the hole B is narrower than the AU (control grid interval). The deviation amount in the shot position between A and B at that time is set as the overlapping amount Xor2. That is, the relationship of P2=AU−Xor2 is established.

Herein, the dose D of the beam of each shot is defined at a position of ½ of an interval P (pitch) between the irradiation positions of the beams of the shots adjacent to each other horizontally (−x direction and +x direction) as a boundary. In FIGS. 15A and 15B, the boundary which is the position of ½ of the interval P (pitch) between the irradiation positions is marked with a dotted line. Herein, as one example, a case of acquiring the dose of the beam passing through the hole A based on the irradiation position of the shot pattern by the beam passing through the hole A (x=0) will be described. The doses of the beams passing through other holes may also be acquired similarly.

In the maximum dose computing process (S106), the maximum dose computing unit 12 computes the maximum dose of each beam passing through each hole. The maximum dose is computed according to the overlapping amount Xor (deviation amount). The maximum dose Dmax is defined as Equation (2) below by using the overlapping amount Xor, AU and the maximum dose $D_0$ having been set in advance.

$$Dmax = D_0 \cdot \{(P1/AU + P2/AU)/2\} \quad (2)$$
$$= D_0 \cdot (P1 + P2)/2AU$$
$$= D_0 \cdot \{(AU - Xor1)/AU + (AU - Xor2)/AU\}/2$$
$$= D_0 \cdot (2AU - Xor1 - Xor2)/2AU$$
$$= D_0 \cdot \{1 - (Xor1 + Xor2)/2AU\}$$

For example, in the example of FIG. 15A, since Xor2=0 with respect to the dose Da of the beam passing through the hole A, Dmax=$D_0 \cdot$(1−Xor1/2 AU). Meanwhile, in the example in FIG. 15B, since Xor2 is not 0, Dmax=$D_0 \cdot$\{1−(Xor1+Xor2)/2 AU\}.

As such, the maximum dose Dmax is appropriately computed depending on a ratio between the AU (control grid interval) and the overlapping amounts Xor1 and Xor2 (deviation amounts). When the entire surface of the shot which is narrower than the predetermined AU interval is so-called fully written, the maximum dose Dmax is limited so that the total dose in the vicinity is the same (specified value). In the example of FIG. 15A, the maximum dose is limited from $D_0$ to Dmax with respect to the beam passing through the hole H and the beam passing through the hole A. In the example of FIG. 15B, the maximum dose is limited from $D_0$ to Dmax with respect to the beam passing through the hole H, the beam passing through the hole A and the beam passing through the hole B.

As described above, as illustrated in FIG. 15A, a maximum dose maxDose of the dose of each beam passing through the hole H or A associated with the deviation is smaller than a maximum dose maxDose of the dose of the beam passing through the hole G or B which is not associated with the deviation. As illustrated in FIG. 15A, at an intermediate position (an intermediate position between the irradiation positions) of the neighboring beams passing through the holes H and A associated with the deviation, the dose of the beam is controlled so that a dose of one of the neighboring beams (herein, for example, the beam passing through the hole H) is 0 and a dose of the another one of the neighboring beams (herein, for example, the beam passing through the hole A) is the maximum dose of the another one of the neighboring beams.

As illustrated in FIG. 15B, the maximum dose maxDose of the dose of each beam of the hole H, A, or B associated with the deviation is smaller than the maximum dose maxDose of the dose of the beam passing through the hole G which is not associated with the deviation. As illustrated in FIG. 15B, at an intermediate position (an intermediate position between the irradiation positions) of the neighboring beams passing through the holes H, A, and B associated with the deviation, the dose of the beam is controlled so that a dose of one of the neighboring beams (herein, for example, the beam passing through the hole A) is 0 and a dose of the another one of the neighboring beams (herein, for example, the beam passing through the hole H) has the maximum dose of the another one of the neighboring beams.

In the dose computing process (S108), the dose computing unit 14 reads the shot data and computes a dose D of the beam for each shot according to the shot data. Each dose is calculated according to which position of the X coordinate illustrated in FIG. 15B the edge position X of the pattern 40 illustrated in FIG. 13C is positioned at.

The dose Da of the beam passing through the hole A will be described.

In the case of X<−P1/2, Da=0 is computed.

In the case of −P1/2<X≤P2/2, Da=$D_0$·(1/AU)·(X+P1/2) is computed.

In the case of X>P2/2, Da=Dmax.

As described above, in the examples of FIGS. 15A and 15B, the dose of each beam varies on the boundary in primary proportion to a slope (1/AU). In the case of the shot at the interval which is narrower than the AU interval, the maximum dose Dmax is limited to a value smaller than $D_0$.

As can be seen by referring to the calculation equation of the dose, the dose may be calculated regardless of the beam size. As a result, the beam size may be set to an arbitrary value regardless of the calculation of the dose.

The calculation equation of the dose is not limited to a primary equation. The calculation equation may be a polynomial function of 2 dimensions or more. For example, in the case of −P1/2<X≤P2/2 described above, Da=$D_0$·(1/AU)·($aX^3+bX^2+cX+d$) may be appropriately computed instead of the above equation. Each coefficient a, b, c, or d may be acquired by a test, simulation or the like.

In the above description, it is presented that the overlapping amount, that is, the overlapping of the beams increases, but the embodiment may be applied to even a case in which the overlapping amount becomes minus, that is, the overlapping of the beams decreases. In this case, Dmax>$D_0$. The aforementioned effect is acquired even with respect to a case in which the overlapping amount is deviated at a predetermined amount in the minus direction.

As described above, according to the embodiment, it is possible to suppress the fluctuation in the shape or size of the pattern due to the deviation of the irradiation positions of the multi-beams, which is caused by the deformation of the optical system or the like. As a result, the high-precision pattern may be written with the multi-beams.

Hereinabove, the embodiments have been described with reference to the detailed examples. However, the embodiments are not limited to these detailed examples.

Parts which are not directly required for the description of the embodiments, such as the device configuration or the control method are not described, but the required device configuration or control method may be appropriately selected and used. For example, a configuration of the control unit controlling the writing apparatus 100 is not described, but it is obvious that the required configuration of the control unit is appropriately selected and used.

Besides, all the multi charged particle beam writing apparatus and multi charged particle beam writing method which include the components of the embodiments and of which the design may be changed by those skilled in the art are included in the scope of the embodiments.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method, comprising:

placing a target object on a stage which is continuously movable in x and y directions;

emitting charged particle beam;

receiving irradiation of the charged particle beam on a region including all of a plurality of openings which are formed in the x and y directions in an aperture member to form multi-beams by making portions of the charged particle beam pass through the plurality of openings;

deflecting the multi-beams by using a blanker in which a plurality of through holes are formed at a placement position of each opening of the aperture member, a part of the multi-beams, which was deflected by the blanker, being blanked;

reducing a plurality of remaining beams which was not blanked, of the multi-beams by using a desired reduction rate, and irradiating with a plurality of reduced beams on the target object; and writing on a stripe of each region, surrounded by beams in 2×2 vertically and horizontally, of the target object in combination of the plurality of reduced beams having passed through different through holes among the plurality of through holes by moving the stage in the x direction continuously at a predetermined velocity and deflecting the plurality of reduced beams as a set together in a same direction to move at a predetermined velocity resulting in a diagonal advancement of the set of reduced beams on the stripe of each region being written, wherein a same region surrounded by beams in 2×2 vertically and horizontally, of the target object is written using different reduced beams of the plurality of reduced beams having passed through the different through holes among the plurality of through holes.

2. The method according to claim 1, wherein the same direction for deflecting the plurality of reduced beams is the y direction, and a movement velocity of the stage and a deflecting velocity of the plurality of reduced beams are controlled so that a writing position on the target object is sequentially deviated in x and y directions by a movement of the stage and a deflection of the plurality of reduced beams.

3. The method according to claim 1, wherein a deflection of the plurality of reduced beams is performed in the y direction, and performed in the x direction so that irradiation positions of the plurality of reduced beams follow a movement of the stage, and a movement velocity of the stage and a deflecting velocity of the plurality of reduced beams are controlled so that a writing position on the target object is sequentially deviated in the y direction.

4. The method according to claim 1, wherein a deflection of the plurality of reduced beams is performed in a direction having an angle of 45° substantially, and a movement velocity of the stage and a deflecting velocity of the plurality of reduced beams are controlled so that a writing position on the target object is sequentially deviated in the y direction.

5. A multi charged particle beam writing method, comprising:

a first step for placing a target object on a stage which is continuously movable in x and y directions;

a second step for emitting charged particle beam;

a third step for receiving irradiation of the charged particle beam on a region including all of a plurality of openings which are formed to x and y directions in an aperture member to form multi-beams by making portions of the charged particle beam pass through the plurality of openings;

a fourth step for deflecting the multi-beams by using a blanker in which a plurality of through holes are formed at a placement position of each opening of the aperture member;

a fifth step for forming a single shot of shot beams, the single shot of shot beams are a plurality of beams, which was not deflected by the blanker, of the multi-beams; and a sixth step for reducing the shot beams by using a desired reduction rate, and irradiating with reduced shot beams on the target object; wherein a desired pattern is written on the target object by repeating the third to sixth steps, and each region of a stripe, surrounded by shot beams in 2×2 vertically and horizontally, of the target object is written in combination of an arbitrary shot beam and other shot beams of the reduced shot beams having passed through different through holes among the plurality of through holes by moving the stage in the x direction continuously at a predetermined velocity and deflecting the reduced shot beams as a set together in a same direction to move at a predetermined velocity resulting in a diagonal advancement of the set of reduced beams on the stripe of each region being written, wherein a same region surrounded by beams in 2×2 vertically and horizontally, of the target object is written using different reduced beams of the plurality of reduced shot beams having passed through the different through holes among the plurality of through holes.

6. The method according to claim 5, wherein the same direction for deflecting the reduced shot beams is the y direction, and a movement velocity of the stage and a deflecting velocity of the reduced shot beams are controlled so that a writing position on the target object is sequentially deviated in the x and y directions by a movement of the stage and a deflection of the reduced shot beams.

7. The method according to claim 5, wherein a deflection of the reduced shot beams is performed in the y direction, and performed in the x direction so that irradiation positions of the reduced shot beams follow a movement of the stage, and a movement velocity of the stage and a deflecting velocity of the reduced shot beams are controlled so that a writing position on the target object is sequentially deviated in the y direction.

8. The method according to claim 5, wherein a deflection of the reduced shot beams is performed in a direction having an angle of 45° substantially, and a movement velocity of the stage and a deflecting velocity of the reduced shot beams are controlled so that a writing position on the target object is sequentially deviated in the y direction.

\* \* \* \* \*